US012772521B2

(12) United States Patent
Sadovnikov et al.

(10) Patent No.: US 12,772,521 B2
(45) Date of Patent: Oct. 20, 2026

(54) METHOD OF FABRICATING LDMOS TRANSISTOR WITH DEEP WELL IMPLANT THROUGH UNMASKED GATE STRUCTURE AND A SHALLOW WELL IMPLANT THROUGH MASKED GATE STRUCTURE

(71) Applicant: Texas Instruments Incorporated, Dallas, TX (US)

(72) Inventors: Alexei Sadovnikov, Sunnyvale, CA (US); Ming-Yeh Chuang, McKinney, TX (US); Jingjing Chen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 687 days.

(21) Appl. No.: 17/727,892

(22) Filed: Apr. 25, 2022

(65) Prior Publication Data

US 2023/0343828 A1 Oct. 26, 2023

(51) Int. Cl.
*H10D 62/17* (2025.01)
*H10D 30/01* (2025.01)
(Continued)

(52) U.S. Cl.
CPC ....... *H10D 62/371* (2025.01); *H10D 30/0281* (2025.01); *H10D 30/65* (2025.01); (Continued)

(58) Field of Classification Search
CPC .. H10D 62/371; H10D 30/0281; H10D 30/65; H10D 62/393; H10D 62/199; H10D 8/812; H10D 18/00; H10D 30/0229; H10D 84/144; H10D 84/619; H10D 84/206; H10D 30/603; H10D 30/0221; H10D 62/109; H10D 62/299; H10D 62/151; H10D 62/307; H10D 64/516; H10D 62/124; H01L 21/26513; H01L 21/266; H01L 21/74; H01L 21/2652; H10F 77/241;
(Continued)

(56) References Cited

U.S. PATENT DOCUMENTS

2009/0224339 A1* 9/2009 Gogoi .................. H10D 62/104 257/413
2012/0126324 A1* 5/2012 Takeda ................. H10D 62/371 257/E21.409

(Continued)

*Primary Examiner* — William B Partridge
*Assistant Examiner* — Erik A. Anderson
(74) *Attorney, Agent, or Firm* — Andrew R. Ralston; Charles F. Koch

(57) ABSTRACT

A method of fabricating a transistor includes forming a gate structure over a semiconductor substrate having a first conductivity type. A photoresist layer is patterned over the gate structure to remove the photoresist layer from over an uncovered portion of the gate structure and an adjacent region of the semiconductor substrate abutting the uncovered portion of the gate structure. A deep well region having the first conductivity type is formed using a first dopant such that the first dopant penetrates through the uncovered portion of the gate structure and is blocked by the photoresist layer. A shallow well region is formed by implanting a second dopant such that the second dopant penetrates the adjacent region and is blocked by the uncovered portion of the gate structure.

19 Claims, 6 Drawing Sheets

(51) Int. Cl.

| | |
|---|---|
| ***H10D 30/65*** | (2025.01) |
| ***H10P 30/20*** | (2026.01) |
| ***H10P 30/22*** | (2026.01) |
| ***H10W 15/00*** | (2026.01) |

(52) U.S. Cl.
CPC ......... *H10D 62/393* (2025.01); *H10P 30/204* (2026.01); *H10P 30/21* (2026.01); *H10P 30/22* (2026.01); *H10W 15/00* (2026.01); *H10W 15/01* (2026.01)

(58) Field of Classification Search
CPC ...... H10F 77/254; H10P 30/204; H10P 30/21; H10P 30/22; H10P 30/212; H10W 15/00; H10W 15/01
See application file for complete search history.

(56) References Cited

U.S. PATENT DOCUMENTS

| | | | | |
|---|---|---|---|---|
| 2012/0193711 | A1* | 8/2012 | Asano ................. | H01L 27/0262 257/E29.256 |
| 2015/0041894 | A1* | 2/2015 | Hebert ............... | H10D 30/0281 438/286 |
| 2017/0186856 | A1* | 6/2017 | Han .................. | H01L 21/26586 |
| 2018/0025948 | A1* | 1/2018 | Cho ................... | H10D 30/0227 438/217 |
| 2018/0350979 | A1* | 12/2018 | Reghunathan ....... | H10D 62/158 |
| 2019/0123155 | A1* | 4/2019 | Cai ...................... | H10D 30/603 |
| 2021/0036150 | A1* | 2/2021 | He ........................ | H10D 62/111 |
| 2021/0367073 | A1* | 11/2021 | Snyder ................. | H10D 30/657 |

* cited by examiner

METHOD OF FABRICATING LDMOS TRANSISTOR WITH DEEP WELL IMPLANT THROUGH UNMASKED GATE STRUCTURE AND A SHALLOW WELL IMPLANT THROUGH MASKED GATE STRUCTURE

BACKGROUND

A diffused well (DWELL) region in a laterally-diffused metal-oxide-semiconductor (LDMOS) transistor is sometimes formed prior to formation of a gate structure and sometimes formed after the gate structure has been fabricated. The method used may affect the threshold voltage and leakage. The DWELL region may also affect a connection to underlying layers and lateral isolation.

SUMMARY

Disclosed implementations form the DWELL region after fabrication of a gate structure, which may be polysilicon, including an overlying antireflective coating (ARC) layer. A thick photoresist layer has been deposited and patterned to expose both the region adjacent to the gate structure and the edge of the gate structure. The gate structure and ARC layer form a hardmask for shallow implants of both boron and arsenic, while deep boron implants can pass through the gate structure and are blocked only by the thick photoresist layer.

In one aspect, an implementation of a method of fabricating a transistor is disclosed. The method includes forming a gate structure over a semiconductor substrate having a first conductivity type. A photoresist layer is patterned over the gate structure to remove the photoresist layer from over an uncovered portion of the gate structure and an adjacent region of the semiconductor substrate abutting the uncovered portion of the gate structure. A deep well region having the first conductivity type is formed using a first dopant such that the first dopant penetrates through the uncovered portion of the gate structure and is blocked by the photoresist layer. A shallow well region is formed by implanting a second dopant such that the second dopant penetrates the adjacent region and is blocked by the uncovered portion of the gate structure.

In another aspect, an implementation of an LDMOS transistor is disclosed. The LDMOS transistor includes a semiconductor substrate including an epitaxial layer having a first conductivity type. A shallow well region having the first conductivity type extends from a top surface of the substrate into the epitaxial layer. A drift region having an opposite second conductivity type extends from the top surface into the epitaxial layer. A channel region of the epitaxial layer at the top surface is located between the shallow well region and the drift region. A gate structure is located over the channel region and between a source contact and a drain contact having the second conductivity type. A deep well region having the first conductivity type extend from under the shallow well region toward the drift region, with the channel region located between the deep well region and the gate structure.

In yet another aspect, a method of fabricating an LDMOS transistor is disclosed. The method includes forming a source region and a drain region having a first conductivity type in a semiconductor substrate that has a different second conductivity type. A gate structure is formed between the source region and the drain region. A shallow well region having the second conductivity type is formed extending from the source region under the gate structure toward the drain region. A deep well region having the second conductivity type is formed under the shallow well region. The deep well region has a dopant concentration with a first local maximum at a first depth under the source region and a second local maximum at a different second depth under the gate structure, the second depth less than the first depth.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION

Specific implementations will now be described in detail with reference to the accompanying figures. In the following detailed description of implementations, numerous specific details are set forth in order to provide a more thorough understanding of the disclosure. However, it will be apparent to one of ordinary skill in the art that other implementations may be practiced without these specific details. In other instances, well-known features have not been described in detail to avoid unnecessarily complicating the description.

Figure 4:
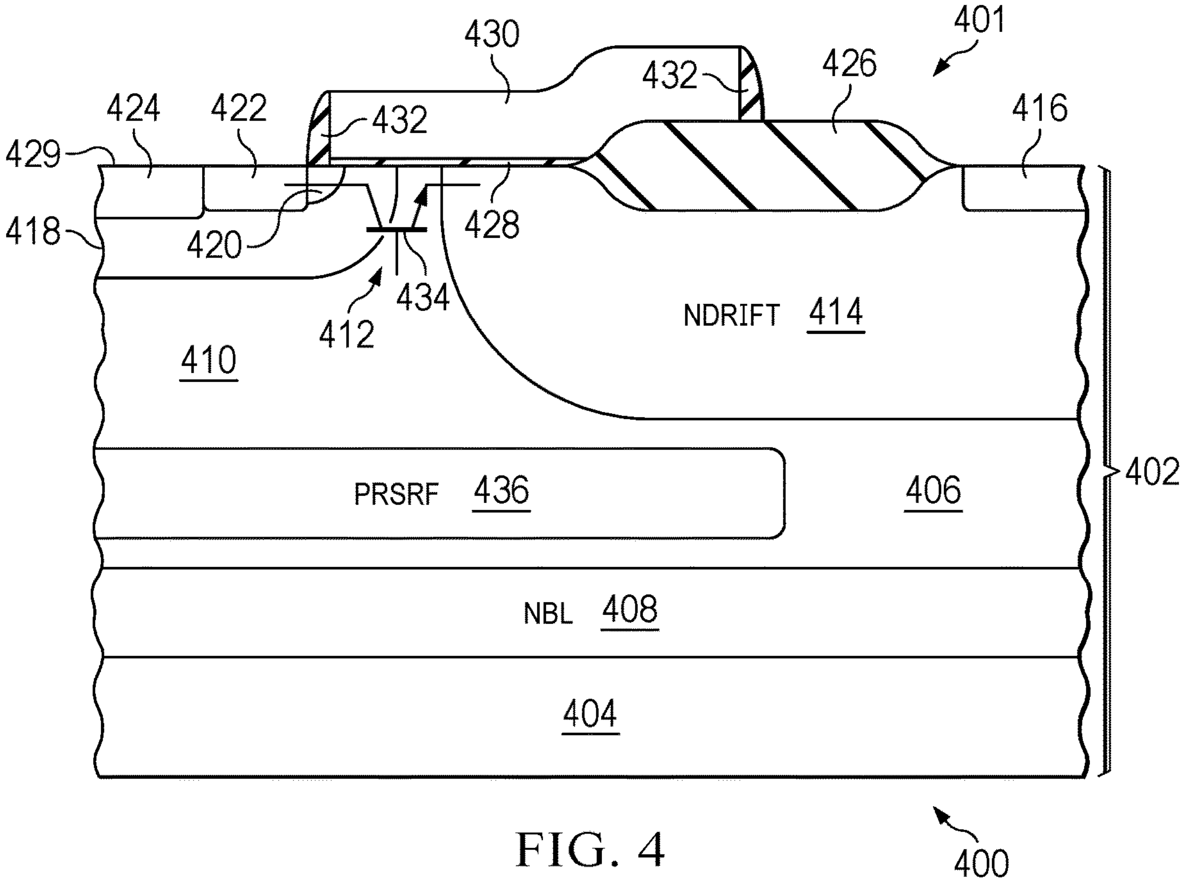
FIG. 4 depicts an LDMOS transistor according to a baseline implementation.

FIG. 4 depicts a cross-sectional view of an LDMOS transistor 400 fabricated in an integrated circuit (IC) 401 according to a baseline implementation. A semiconductor substrate 402 includes a P-type bulk silicon wafer 404 over which a P-type epitaxial (epi) layer 406 has been grown. An N-type buried layer (NBL) 408 provides isolation below the LDMOS transistor 400. The LDMOS transistor 400 has a P-type body region 410 that is a portion of the epi layer 406 that includes a channel region 412. An N-type drift (NDRIFT) region 414 and a first NSD (drain) region 416 are located on one side of the channel region 412. A combined source/backgate contact region is located on an opposite side of the channel region 412. The combined region includes a P-type DWELL region 418, an N-type DWELL region 420, a second NSD (source) region 422, and a PSD region 424 as a backgate contact to the P-type body region 410. A local oxidation of silicon (LOCOS) structure 426 lies over a portion of the NDRIFT region 414; a gate oxide 428 lies on a surface 429 of the semiconductor substrate 402 and over the channel region 412. A polysilicon gate 430 lies partially over the gate oxide 428 and partially over the LOCOS structure 426, while sidewall spacers 432 are located on sidewalls of the polysilicon gate 430.

In addition to the structures and regions that define the LDMOS transistor 400, a lateral parasitic NPN transistor 434 has an emitter provided by the second NSD region 422, a collector provided by the NDRIFT region 414, and a base provided by the P-type body region 410. Inadvertent turn-on of the parasitic NPN transistor 434 can be decreased or avoided by maintaining the voltage on the P-type body region 410 as close to the voltage on the second NSD region 422 as possible. Although not shown in the LDMOS transistor 400, a silicide layer shorts the PSD region 424 to the second NSD region 422. This aids maintaining the parasitic NPN transistor 434 in an off condition, but at some design voltages, these elements are not enough to provide the quick response needed to prevent turn-on of the parasitic NPN transistor 434. A P-type resurf (PRSRF) region 436 may be added at these voltages and may result in a better safe operating area (SOA) and may reduce the current gain (Hfe) of the parasitic NPN 434 for better isolation, but the connection between the PSD region 424 and the PRSRF region 436 may be insufficient to provide effective protection against parasitic effects.

The present application discloses LDMOS transistors with improved connection between the PSD region 424 and the PRSRF region 436, and methods of forming such transistors. An improvement to this connection reduces the NPN transistor's base resistance, which in this implementation includes the vertical resistance between the PSD region 424 and the PRSRF region 436. Lower base resistance results in smaller emitter-base forward bias, so that the NPN transistor 434 is less likely to turn on. This improvement may be provided using an existing flow for forming the LDMOS transistor 400 and IC 401, without the need for additional masks. To place the improvements in context, an understanding of previous methods may be helpful.

As noted in the example of LDMOS transistor 400, the N-type DWELL region 420 may form a portion of a source region and the P-type DWELL region 418 may form a portion of a backgate connection to the P-type body region 410 of the transistor. These DWELL regions may define a threshold voltage (Vth) for the LDMOS transistor and may affect leakage. The DWELL implants may also be used to improve the connection to the PRSRF region. To obtain these results, the DWELL implants may include both high dose shallow P-type implants and lower dose deep P-type implants. The DWELL implants may be performed shortly before gate fabrication or else shortly after the gate fabrication for baseline devices.

When DWELL fabrication is done before the gate fabrication, a thick photoresist layer may be used as a mask for the implantations. Use of the thick photoresist layer may result in small variations in the sidewall angle near the bottom of the photoresist layer and may cause noticeable differences in lateral profiles of the shallow implants, resulting in undesirable variability of the threshold voltage. When the DWELL fabrication is done after the gate fabrication, a combination of the polysilicon gate and an ARC layer may function as a hardmask. The hardmask provides significantly smaller sidewall variability, but the lesser thickness of this hardmask does not allow the use of a high-energy, deep boron implant and can result in a poor connection to the PRSRF region, a worse SOA, and decreased lateral isolation.

Applicants combine aspects of these two methodologies in that the DWELL implant stage is performed after formation of a gate structure, but also uses a thick photoresist layer to provide the ability to implant deep, high energy regions. In one implementation, the gate structure may be polysilicon and may include an ARC layer over the polysilicon. The thick photoresist layer is pulled back from an edge of the gate structure to expose both the edge of the gate structure and the substrate adjacent the gate structure. The exposed portion of the gate structure allows high energy dopants, which in one implementation may be boron, to pass through the gate structure to form deeper regions, while blocking the low energy dopants, which may include boron and arsenic, during formation of shallow DWELL regions. This combination of high energy dopants implanted through the exposed gate structure and low energy dopants blocked by the gate structure may simultaneously achieve less variability in the threshold voltage and improved SOA and lateral isolation. The example provided here includes an N-type LDMOS transistor; however, a P-type LDMOS transistor may also be fabricated using the disclosed method by reversing the types of dopants in each of the regions.

Figure 1:
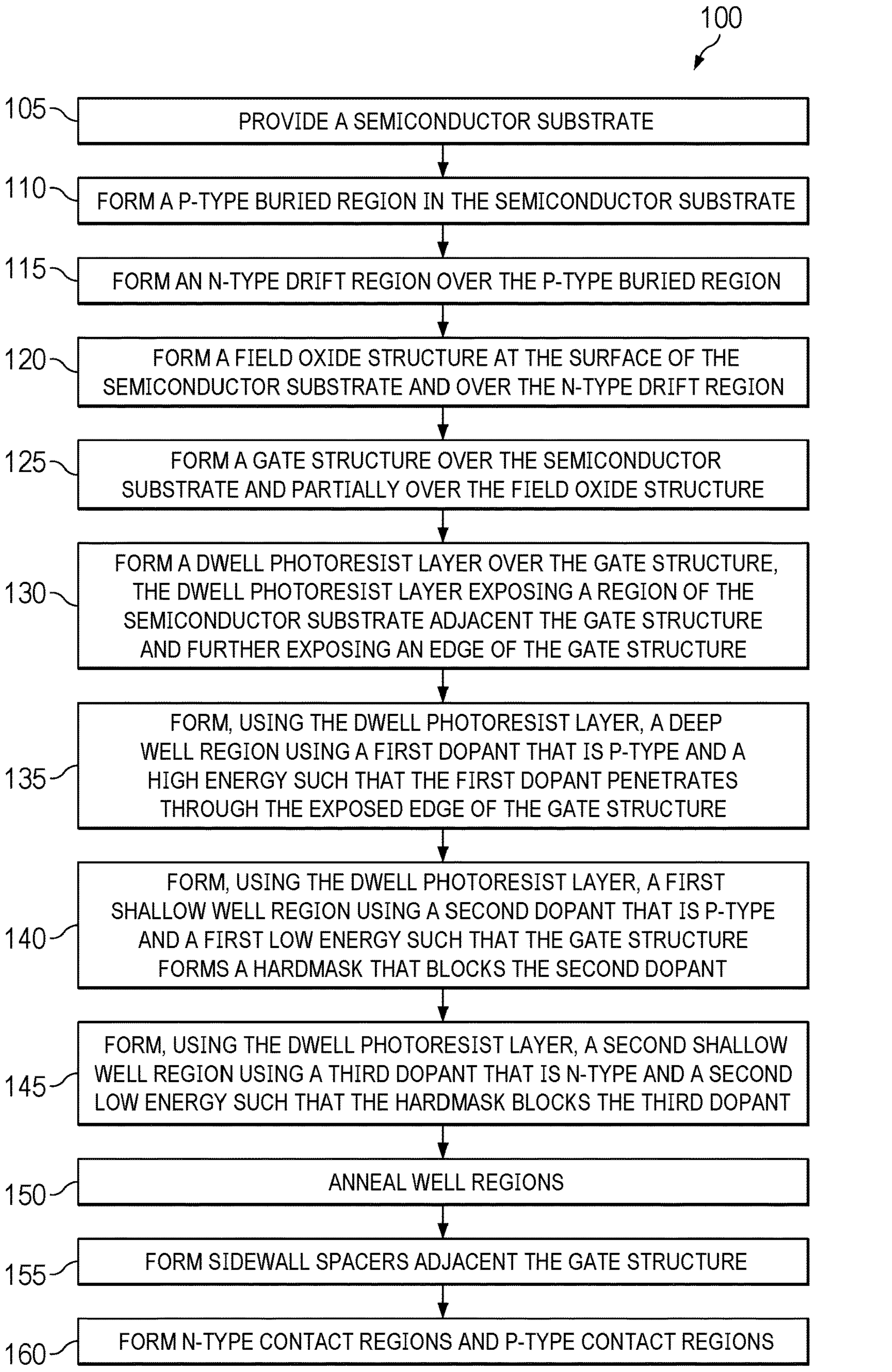
FIG. 1 depicts a flowchart of a method of fabricating a transistor according to an implementation of the disclosure.

FIG. 1 depicts a method 100 of fabricating an LDMOS transistor, while FIGS. 2A-2E each depicts a different stage during the process. These figures will be discussed in conjunction with each other. The method 100 begins with providing a semiconductor substrate (105). The present application describes an LDMOS transistor formed using a silicon substrate, although other semiconductor substrates may also be utilized, e.g., gallium arsenide, germanium, etc. The silicon substrate may include one or more epitaxial layers and may contain a buried layer. The method continues with forming a P-type buried region in the semiconductor substrate (110). This P-type buried region may form a reduced surface field (RESURF) region. This may be followed by forming an N-type drift region over the P-type buried region (115).

Figure 2A:
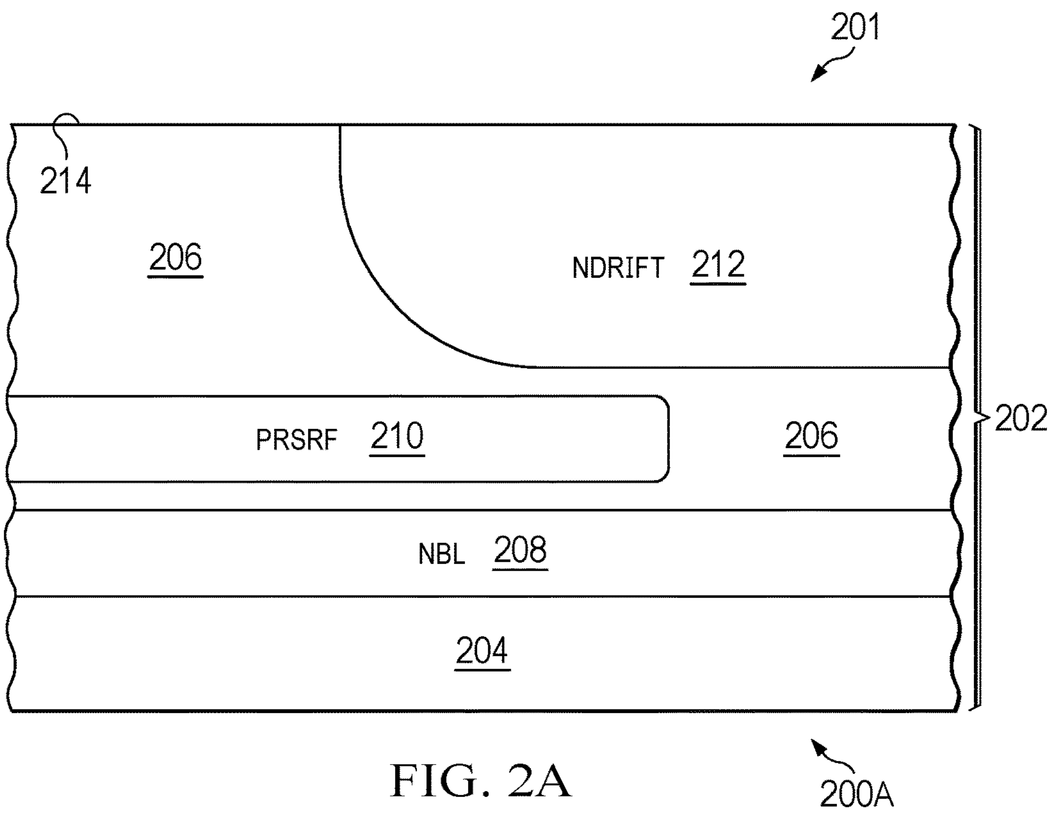
FIGS. 2A-2E illustrate various stages in the fabrication of an LDMOS transistor according to an implementation of the disclosure.

FIG. 2A depicts a stage 200A in the fabrication of an LDMOS transistor 201 in which a semiconductor substrate 202 includes a silicon wafer 204 over which a P-type epitaxial layer 206 has been grown or deposited. This example includes an optional N-type buried layer 208 (NBL). The NBL 208 may be formed by any known or future-developed method. In one example an initial epitaxial layer is formed on which a hard mask is deposited, patterned, and etched to expose desired locations for the NBL 208. An N-type dopant such as arsenic or phosphorus, may be deposited or implanted into the initial epi layer, and then the epi layer 206 is formed thereover. The implanted N-type dopant may diffuse vertically during growth of the epi layer 206, and/or a subsequent diffusion step may complete formation of the NBL 208.

Stage 200A further depicts a P-type buried region 210 and an N-type drift region 212. The P-type buried region 210 may also be called a P-type buried RESURF (PRSRF) region 210 and is located over the NBL 208. (The acronym "RESURF" is used in the semiconductor arts to refer to "Reduced SURface Field".) The PRSRF region 210 may be formed using a thick resurf photoresist layer (not explicitly shown) deposited and patterned on a top surface 214 of the semiconductor substrate 202. A P-type dopant, which may be boron or another P-type dopant, may be implanted through the thick resurf photoresist layer. After removal of the resurf photoresist layer, a drift photoresist layer (not shown) may be deposited and patterned to expose regions of the semiconductor substrate 202 over a planned drift region. An N-type dopant, which may be phosphorus, arsenic, etc., may be implanted into the semiconductor substrate 202 using one or more implantation processes. In one implementation, an anneal process may be used to diffuse the dopant to form the N-type drift region 212 after removal of the drift photoresist layer.

Figure 2B:
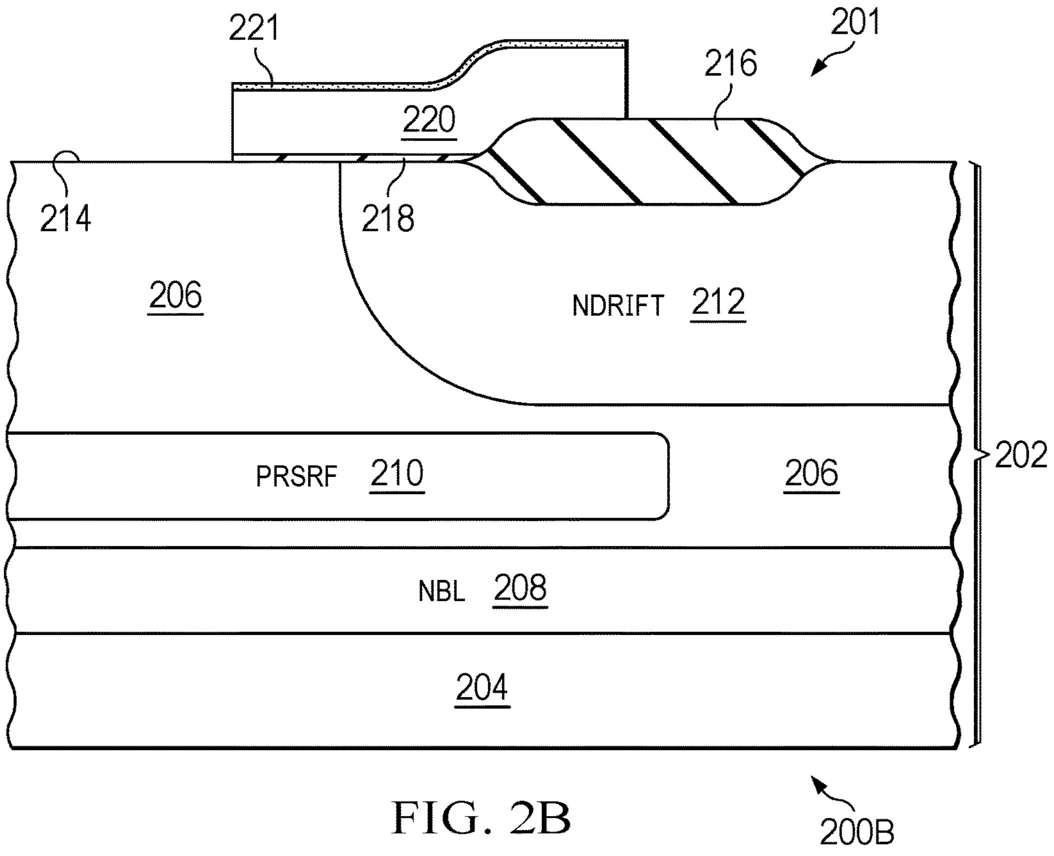

With continued reference to FIG. 1, the method 100 forms a field oxide structure at the surface of the semiconductor substrate and over the NDRIFT region (120). The field oxide structure may be a LOCOS structure, a shallow trench isolation (STI) structure, or other field oxide structure. The method 100 also forms a gate structure over the semiconductor substrate and partially over the field oxide structure (125). FIG. 2B depicts a stage 200B in the fabrication of the LDMOS transistor 201 after a field oxide structure 216, a gate dielectric 218, and a gate structure 220 have been formed. In the implementation shown, the field oxide structure 216 is a LOCOS structure. In one implementation, the LOCOS structure 216 is formed by first depositing and patterning an oxidation blocking layer, e.g., silicon nitride (not explicitly shown), over the top surface 214 of the semiconductor substrate 202 to expose only those areas that are to be oxidized. Field oxidation is performed to grow the LOCOS structure 216, followed by removal of the oxidation blocking layer. The gate dielectric 218 may then be formed, e.g., by oxidation of the top surface 214 of the semiconductor substrate 202 to form a gate oxide. Other gate dielectrics may also be used instead of an oxide.

In implementations that use a polysilicon gate, a polysilicon layer (not explicitly shown) may then be deposited over the top surface 214 of the semiconductor substrate 202 and over the LOCOS structure 216. In some examples the polysilicon layer has a thickness of about 120 nm. An anti-reflective coating (ARC) layer is deposited over the polysilicon layer. The ARC layer may be a dielectric material with a refractive index and a thickness determined to reduce reflection of incident light during exposure of a photoresist used to pattern the gate structure 220. In one example the ARC layer is or includes silicon oxynitride (SiON) and has a thickness of about 750 nm. A gate photoresist layer may be deposited and patterned over the polysilicon layer to cover only those locations where a gate or similar polysilicon structure is desired, leaving other regions exposed. An etch process may then be performed to remove the exposed portions of the polysilicon layer resulting in the gate structure 220 and an ARC layer 221. While present examples provide polysilicon as the gate material, any presently known or future-developed material may be used that is otherwise able to perform as described for the gate structure 220.

With continued reference to FIG. 1, the method 100 continues with forming a DWELL photoresist layer over the gate structure and also over the top surface 214 of the semiconductor substrate. After patterning, the DWELL photoresist layer exposes a region of the semiconductor substrate adjacent the gate structure and further exposes an edge of the gate structure (130). While this DWELL photoresist layer remains in place, various implantation processes form at least three regions within the semiconductor substrate. A first dopant that is P-type is implanted at a relatively high energy to form a deep well region (135). The first dopant has sufficient energy to pass through the exposed portion of the gate structure 220 and ARC layer 221. A second dopant that is also P-type is implanted at a first relatively low energy to form a first shallow well region (140). The energy of the second dopant is too low for the second dopant to pass through the gate structure 220 and ARC layer 221, and is thus blocked. Therefore the second dopant is implanted only in the exposed semiconductor substrate adjacent the gate structure 220. A third dopant that is N-type is implanted at a second relatively low energy to form a second shallow well region (145). The third dopant is also blocked by the gate structure 220 and the ARC layer 221 and is therefore implanted substantially only in the exposed semiconductor substrate adjacent the gate structure 220. In various examples the second dopant is smaller in size than the third dopant, The second dopant may therefore diffuse into the semiconductor substrate a greater distance than the third dopant during a later diffusion step.

Figure 2C:
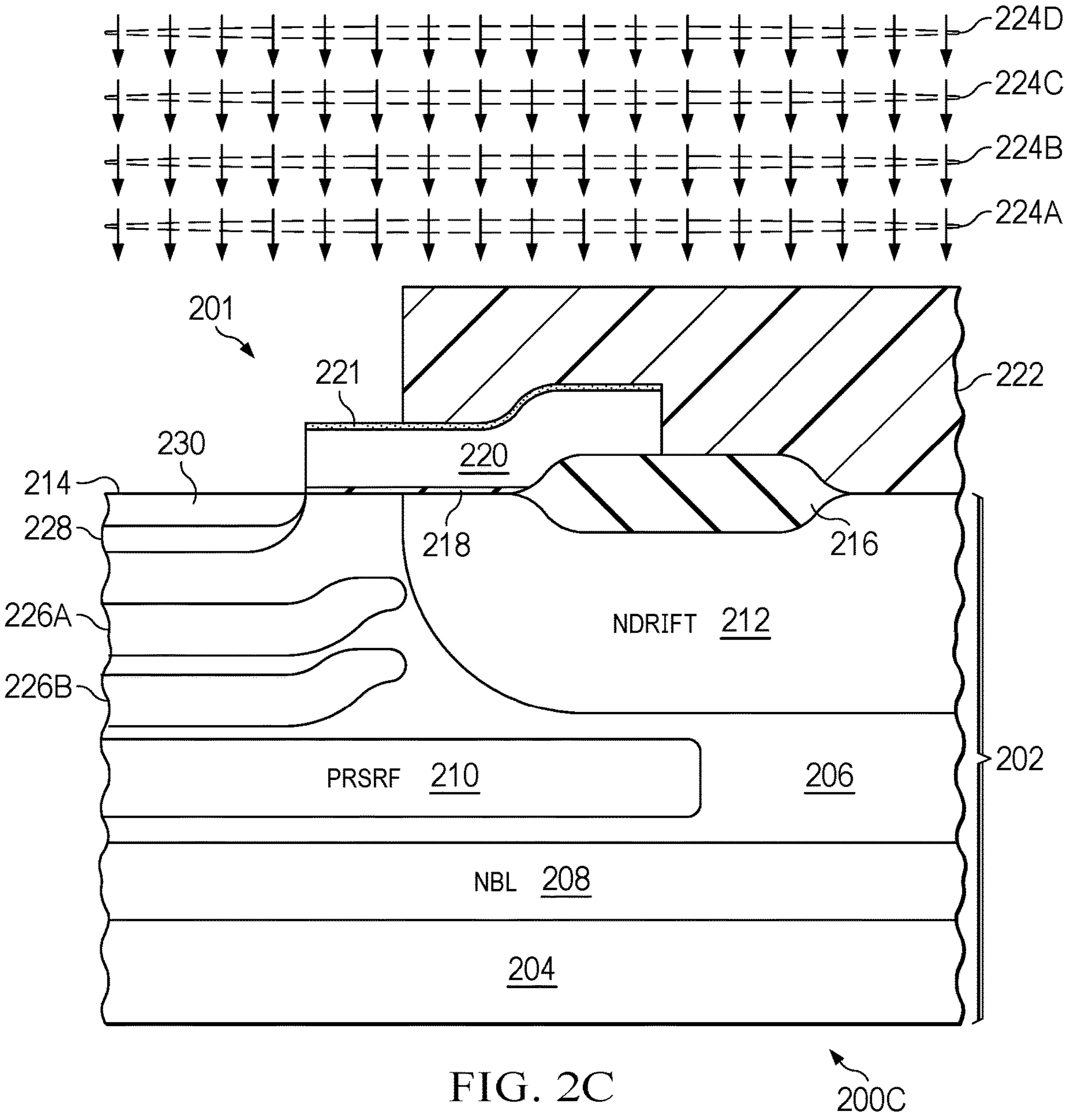

FIG. 2C depicts a stage 200C in the fabrication of the LDMOS transistor 201 in which a DWELL photoresist layer 222 has been deposited and patterned over the gate structure 220 and four implantation processes are completed, of which implantation processes 224A, 224B, 224C and 224D are representative. The implantation process 224A uses the second dopant (P-type) to form a first shallow DWELL region 228, and the implantation process 224B uses the third dopant (N-type) to form a second shallow DWELL region 230. As can be seen at stage 200C, the first shallow DWELL region 228 and the second shallow DWELL region 230 are each aligned with the edge of the gate structure 220 (sometimes described as self-aligned).

In the illustrated example implementation the first dopant (P-type) is used to form a deep well region 226 using two separate implants at different energies. The implantation process 224C uses the first dopant to form a first deep well sub-region 226A and the implantation process 224D uses the first dopant to form a second deep well sub-region 226B. The deep well sub-regions 226A and 226B are initially aligned with the DWELL photoresist layer 222. A first portion of the first dopant that is unobstructed by the gate structure 220 is implanted more deeply that a second portion of the first dopant that is implanted through the gate structure 220. Thus the deep well sub-regions 226A and 226B are each deeper under the first and second shallow DWELL regions 228, 230 and shallower under the gate structure 220.

In an example implementation the first dopant and the second dopant may both be boron and the third dopant may be arsenic. In an implementation using boron and arsenic, the implantation process 224A forms the first shallow DWELL region 228, which may also be referred to herein as a first P-type well region 228, by implanting a boron dose in the range of about 8e13 atoms/cm$^2$ to about 3e14 atoms/cm$^2$ (e.g., 1.3e14 atoms/cm$^2$) at an energy in the range of about 20 keV to about 40 keV (e.g., 30 keV). The implantation process 224B forms the second shallow DWELL region 230, which may also be referred to herein as an N-type well region 230, by implanting an arsenic dose in the range of about 5e13 atoms/cm$^2$ to about 4e15 atoms/cm$^2$ (e.g., 1.6e15 atoms/cm$^2$) at an energy in the range of about 10 keV to about 40 keV (e.g., 30 keV).

In the current example, the deep well region 226, which may also be referred to herein as a second P-type well region 226, is formed by the two separate implantation processes 224C, 224D at different energies to form the first deep well sub-region 226A and the second deep well sub-region 226B. The implantation process 224C may implant a boron dose in the range of about 1e12 atoms/cm$^2$ to about 6e12 atoms/cm$^2$ (e.g., 2e12 atoms/cm$^2$) with an energy in the range of about 500 keV to about 900 keV (e.g., 700 keV). The implantation process 224D may implant a boron dose in the range of about 1e12 atoms/cm$^2$ to about 6e12 atoms/cm$^2$ (e.g., 2.5e12 atoms/cm$^2$) with an energy in the range of about 1 MeV to about 2 MeV (e.g., 1.4 MeV). In the context of doses, the term "about" means ±15%. In the context of implant energy, the term "about" means ±10%.

Returning again to FIG. 1, the method 100 continues, first with annealing the DWELL regions (150), forming sidewall spacers adjacent the gate structure (155), and forming N-type contact regions and P-type contact regions (160).

Figure 2D:
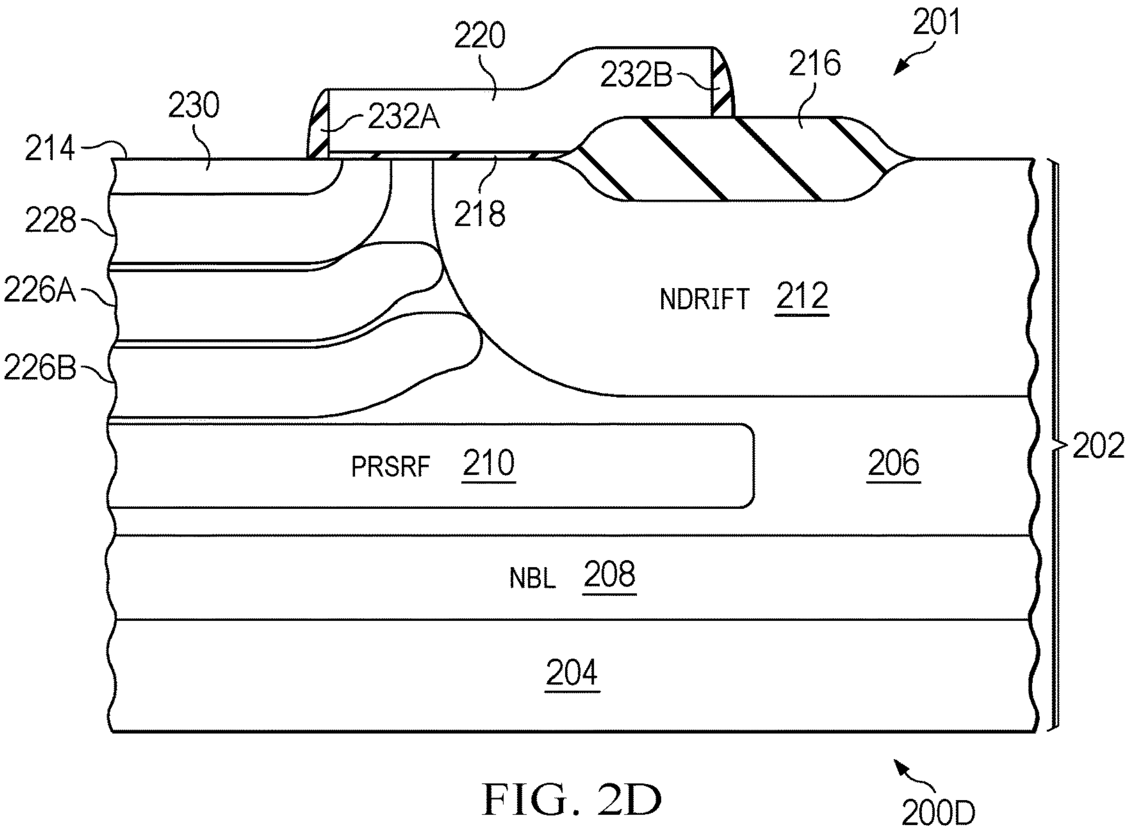

FIG. 2D depicts the LDMOS transistor 201 at a stage 200D after the anneal process (150) for the deep well region 226, the first shallow DWELL region 228, and the second shallow DWELL region 230 and formation (155) of sidewall spacers 232 for the gate structure have been completed. A first sidewall spacer 232A is shown over the second DWELL region 230 and a second sidewall spacer 232B is shown over the LOCOS structure 216. During the anneal process, dopants in each of the DWELL regions 228, 230 will diffuse, with the P-type dopants, e.g., boron, diffusing further than the N-type dopants, e.g., arsenic, due to the generally smaller size of the P-type dopants. The first shallow DWELL region 228 now extends deeper into the semiconductor substrate and also extends further under the gate structure 220 than does the second shallow DWELL region 230, such that the first shallow DWELL region 228 now surrounds the second shallow DWELL region 230. The deep well region 226 has also diffused, both laterally and vertically. The first shallow DWELL region 228, the deep well region 226 and the PRSRF region 210 will ultimately touch each other and form an un-interrupted P-type region. The sidewall spacers 232 may be formed using known processes, e.g., by the deposition of a dielectric layer (not explicitly shown) and a global etch process that removes portions of the dielectric layer that are not protected by a neighboring structure such as the gate structure 220.

Figure 2E:
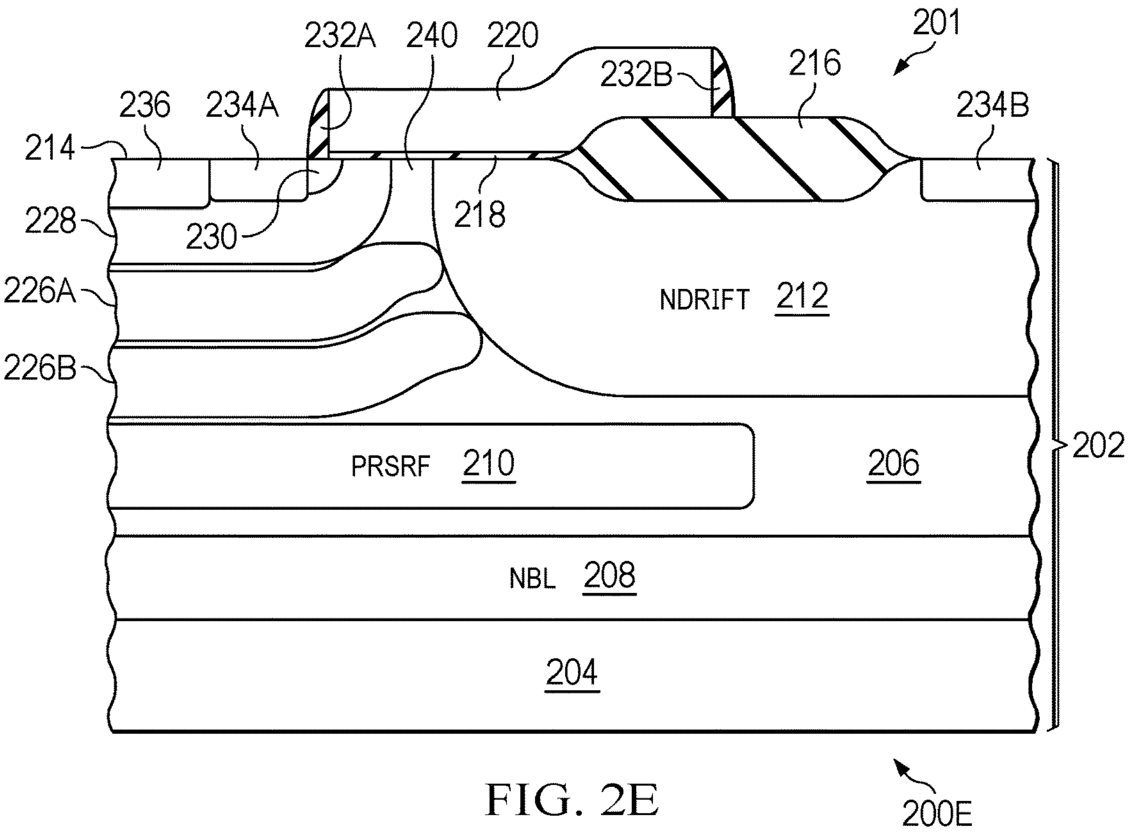

FIG. 2E depicts the LDMOS transistor 201 at a stage 200E after the formation of N-type contact regions 234 and a P-type contact region 236. In one implementation, the N-type contact regions 234 may be formed as N-type source/drain (NSD) regions and the P-type contact region 236 may be formed as P-type source/drain (PSD) regions. In the implementation shown in stage 200E, a first N-type source contact region 234A has been formed in the second shallow DWELL region 230 and adjacent the first sidewall spacer 232A and may be referred to as an N-type source region 234A. A second N-type contact region 234B has been formed in the N-type drift region 212 and adjacent the LOCOS structure 216 and may be referred to as an N-type drain contact region 234B. The P-type contact region 236 has been formed in the second shallow DWELL region 230 and adjacent to the first N-type source contact region 234A and may be referred to as a P-type backgate contact region 236 that may provide an electrical connection through the DWELL region 228 to a body region 240, which is a remaining portion of the epitaxial layer 206. The P-type backgate contact region 236 also provides an electrical connection through the deep well region 226 to the PRSRF 210. The deep well region 226 is able to provide a low resistance path between the P-type backgate contact region 236 and the PRSRF 210 without affecting the threshold voltage of the LDMOS transistor 201 by virtue of the gate structure 220 acting as a hardmask for the implantation processes 224A, 224B.

Figure 3:
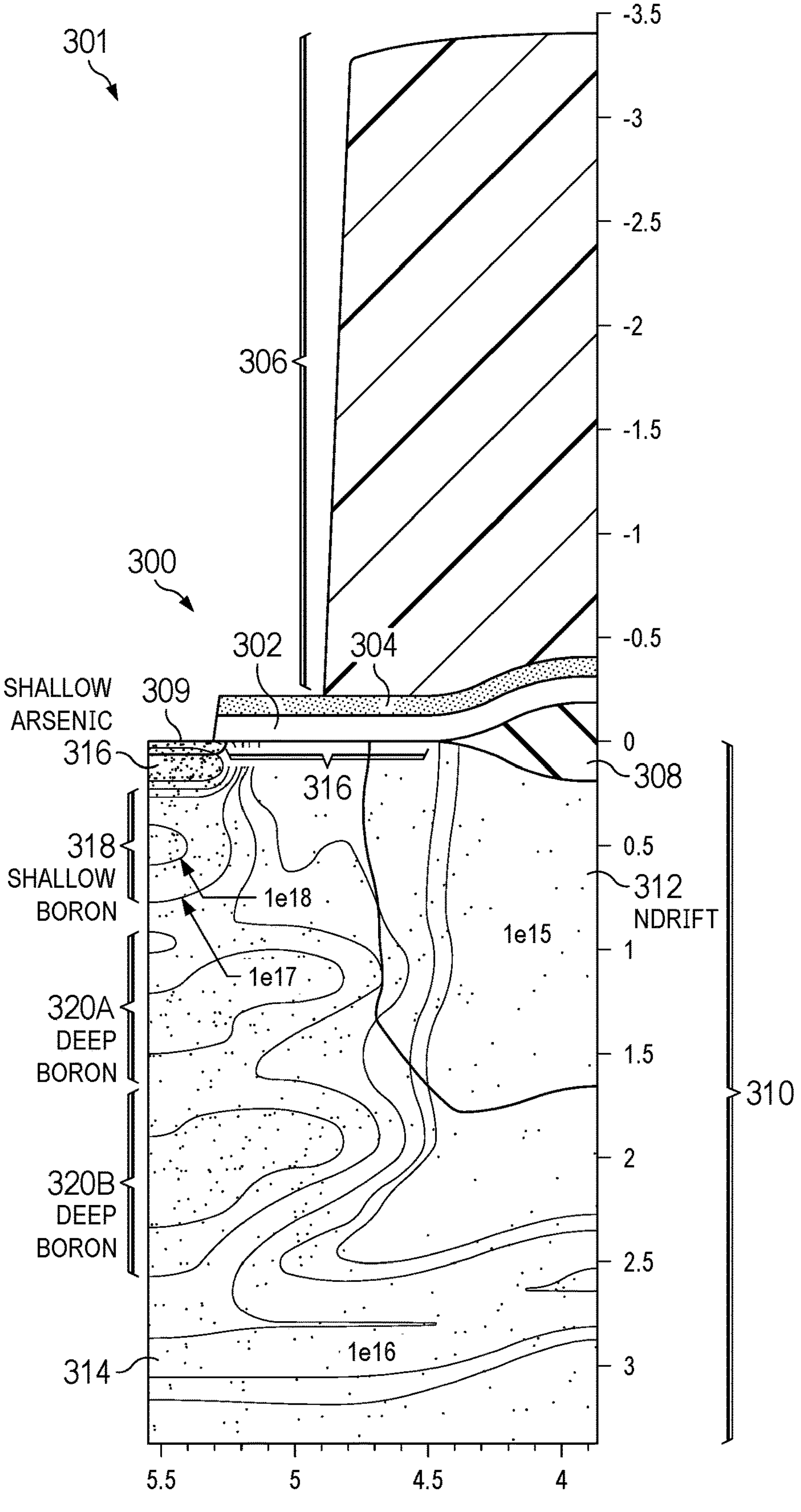
FIG. 3 depicts a representative distribution of dopants after implantation of boron and arsenic in an LDMOS transistor according to an implementation of the disclosure.

FIG. 3 illustrates a cross-sectional view of dopant concentration in an LDMOS transistor 300 in an integrated circuit 301, with a view in the region immediately adjacent to and under portions of a gate structure after the DWELL implants. The view of the LDMOS transistor 300 includes a polysilicon gate structure 302, an ARC layer 304, and a thick DWELL photoresist layer 306 over the polysilicon gate structure 302 and the ARC layer 304. The DWELL photoresist layer 306 lies over portions of the polysilicon gate structure 302 and the ARC layer 304, but does not lie over the edges of either the polysilicon gate structure 302 or the ARC layer 304. A LOCOS structure 308 may be at the surface 309 of a substrate 310 and under a portion of the polysilicon gate structure 302. In the implementation shown, the substrate 310 includes a bulk silicon wafer over which an epitaxial layer has been grown. The substrate 310 also includes a drift region 312 under the LOCOS structure 308 and a PRSRF region 314 that extends across the region shown, including under the drift region 312.

The DWELL implant processes have formed a shallow N-type region 316, a shallow P-type region 318, and deep P-type regions 320, which include a first deep P-type sub-region 320A and a second deep P-type sub-region 320B. In one implementation, the shallow N-type region 316 includes arsenic and both the shallow P-type region 318 and the deep P-type regions 320 include boron. It can be seen in the deep P-type regions 320 that the dopant portions under the polysilicon gate structure 302 did not penetrate as far into the substrate 310 as the dopant portions that did not pass through the polysilicon gate structure 302. An anneal process may be performed after this stage, so that the DWELL regions diffuse outward, with the boron regions diffusing farther than the arsenic or other N-type dopants. The deep P-type DWELL regions can supply greater connectivity between the backgate region (not explicitly shown in this figure) and the PRSRF region 314.

Applicants have disclosed a method or forming an improved connection between the backgate region of an LDMOS transistor and a P-type resurf region below the LDMOS transistor, as well as an associated LDMOS transistor. Although this method has been designed with a polysilicon gate in mind, other gate materials may also be used in the fabrication of the disclosed LDMOS transistor if the gate material will allow high energy dopants to pass through but will block shallower, low energy dopants.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A method of fabricating an integrated circuit, the method comprising:

forming a first oxide layer having a first thickness over a semiconductor substrate having a first conductivity type, forming a second oxide layer over the semiconductor substrate and touching the first oxide layer, the second oxide layer having a greater second thickness;

forming a gate structure that extends over the first and second oxide layers;

forming a patterned photoresist layer that extends over the gate structure and second oxide layer, and exposes a portion of the semiconductor substrate and an uncovered portion of the gate structure between the substrate portion and the second oxide layer;

forming a shallow well region by implanting a first dopant such that the first dopant penetrates the exposed substrate portion and is blocked by the uncovered portion of the gate structure; and forming a deep well region having the first conductivity type by implanting a second dopant such that the second dopant penetrates through the uncovered portion of the gate structure, wherein implanting the second dopant includes implanting the second dopant at a first energy through the uncovered portion of the gate structure thereby producing a first deep well sub-region with a first peak dopant concentration under the gate structure, and implanting the second dopant at a greater second energy through the uncovered portion of the gate structure thereby producing a second deep well sub-region with a second peak dopant concentration under the gate structure, the first peak dopant concentration being between the second peak dopant concentration and the gate structure, and wherein the patterned photoresist layer blocks the second dopant from being implanted into the semiconductor substrate positioned under the patterned photoresist layer during the implanting of the second dopant at the first and second energies such that the first and second deep well sub-regions do not extend within the semiconductor substrate under the patterned photoresist layer.

2. The method as recited in claim 1 wherein the shallow well region is a first shallow well region and including forming a second shallow well region having a different second conductivity type using a third dopant such that the gate structure blocks the third dopant.

3. The method as recited in claim 2 including:

forming a drift region that intersects a top surface of the semiconductor substrate under the gate structure, the drift region having the second conductivity type; and forming a buried region having the first conductivity type that extends under the first shallow well region and the drift region.

4. The method as recited in claim 3 including forming a field oxide structure along a top surface of the semiconductor substrate and over the drift region, the gate structure being located partially over the field oxide structure.

5. The method as recited in claim 1 wherein depths of the first and second peak dopant concentrations decrease in a direction from under the exposed substrate portion toward the gate structure.

6. The method as recited in claim 2 including, after forming the second shallow well region, forming a sidewall spacer abutting the gate structure, a portion of the sidewall spacer located over the second shallow well region.

7. The method as recited in claim 3 including:

forming a first contact region having the second conductivity type in the second shallow well region;

forming a second contact region having the second conductivity type in the drift region; and forming a third contact region having the first conductivity type in the second shallow well region, the third contact region touching the first shallow well region.

8. The method as recited in claim 7 wherein:

the second shallow well region, the drift region, and the first and second contact regions include arsenic; and the deep well region, the first shallow well region, and the buried region include boron.

9. The method as recited in claim 5 wherein forming the first deep well sub-region includes implanting boron at a dose in a range of 8.5e11 atoms/$cm^2$ to 6.9e12 atoms/$cm^2$ and an energy in the range of 425 keV to 1035 keV, and forming the second deep well sub-region includes implanting boron at a dose in a range of 8.5e11 atoms/$cm^2$ to 6.9e12 atoms/$cm^2$ and an energy in the range of 0.9 MeV to 2.2 MeV.

10. The method as recited in claim 2 wherein forming the first shallow well region includes implanting boron at a dose in a range from 6.8e13 atoms/$cm^2$ to 3.45e14 atoms/$cm^2$ and an energy in a range from 18 keV to 44 keV, and forming the second shallow well region includes implanting arsenic at a dose in a range from 4.25e13 atoms/$cm^2$ to 4.6e15 atoms/$cm^2$ and an energy in a range from 9 keV to 44 keV.

11. A method of fabricating an integrated circuit, the method comprising:

forming a gate electrode over a semiconductor substrate having a first conductivity type;

patterning a photoresist layer over the gate electrode, the patterning producing a photoresist portion that covers a first portion of the gate electrode and completely covers a local oxidation of silicon (LOCOS) layer, exposes a second portion of the gate electrode that overlies a gate dielectric layer, and exposes a portion of the semiconductor substrate;

forming a shallow well region by implanting a first dopant such that the first dopant penetrates the exposed portion of the semiconductor substrate and is blocked by the exposed second portion of the gate electrode and the photoresist portion;

forming a deep well region having the first conductivity type using a second dopant such that the second dopant penetrates through the exposed second portion of the gate electrode, the deep well region having a first peak dopant concentration under the gate electrode at a first depth and a second peak dopant concentration at a second depth between the first depth and the gate electrode; and forming a drift region that extends within the semiconductor substrate under the gate electrode prior to forming the deep well region, wherein the deep well region comprises a first deep well sub-region and a second deep well sub-region, and the patterned photoresist layer blocks the second dopant from being implanted into the semiconductor substrate positioned under the patterned photoresist layer during the implanting of the second dopant such that the first and second deep well sub-regions do not extend within the semiconductor substrate under the patterned photoresist layer.

12. The method as recited in claim 11, wherein the first dopant is boron and the second dopant is boron.

13. The method as recited in claim 11, wherein the deep well region extends from under the shallow well region toward the LOCOS layer, and has a first depth under the shallow well region and a lesser second depth under the gate electrode.

14. The method as recited in claim 1, wherein the first deep well sub-region is spaced apart from the second deep well sub-region after implanting the second dopant at the first and second energies.

15. The method as recited in claim 1, further comprising:

forming a drift region that extends within the semiconductor substrate under the gate structure prior to forming the deep well region, wherein the deep well region touches the drift region.

16. The method as recited in claim 11 wherein the shallow well region is a first shallow well region and including forming a second shallow well region having a different second conductivity type using a third dopant such that the gate electrode blocks the third dopant.

17. The method as recited in claim 16 including:

forming a drift region that intersects a top surface of the semiconductor substrate under the gate electrode, the drift region having the second conductivity type; and forming a buried region having the first conductivity type that extends under the first shallow well region and the drift region.

18. The method as recited in claim 11 wherein depths of the first and second peak dopant concentrations decrease in a direction from under the exposed substrate portion toward the gate electrode.

19. The method as recited in claim 11, wherein the deep well region touches the drift region.

* * * * *